United States Patent [19]

Denzler

[11] Patent Number: 4,897,763
[45] Date of Patent: Jan. 30, 1990

[54] CIRCUIT ARRANGEMENT HAVING A PLURALITY OF ELECTRICAL ELEMENTS TO BE COOLED

[75] Inventor: Emil Denzler, Zurich, Switzerland

[73] Assignee: H.A. Schlatter AG., Schlieren, Switzerland

[21] Appl. No.: 218,560

[22] Filed: Jul. 13, 1988

[30] Foreign Application Priority Data

Aug. 3, 1987 [CH] Switzerland ...................... 02975/87

[51] Int. Cl.[4] ........................ H05K 7/20; H01L 25/04; H02M 1/00
[52] U.S. Cl. .................................. 316/385; 165/80.4; 357/82; 361/381; 361/388; 363/141; 363/147
[58] Field of Search ............................. 165/80.4, 80.5; 174/15 R, 15 CA, 16 HS; 357/79, 82; 361/381, 382, 385, 386, 388; 363/141, 147

[56] References Cited

U.S. PATENT DOCUMENTS

| 3,573,569 | 4/1971 | Davis ................................... 363/141 |
| 4,010,489 | 3/1977 | Bourbeau et al. .................... 361/385 |
| 4,559,580 | 12/1985 | Lutfy ..................................... 361/385 |
| 4,603,344 | 7/1986 | Trommer ............................. 361/396 |

Primary Examiner—Gregory D. Thompson
Attorney, Agent, or Firm—Brady, O'Boyle & Gates

[57] ABSTRACT

The electrical elements to be cooled (111-138) is a low-ohmic high-power source are connected via cooling channels (60-63, 66, 77, 70-72, 76-80) in the electrical conductors (9, 211, 311, 10, 215, 315, . . . ) as parallel cooling circulations to a cooling medium distributor (8). The entire mechanical design of the circuit arrangement is sandwich-like and constitutes an electrodynamically stable and space-saving arrangement without additional fittings between the elements to be cooled.

19 Claims, 2 Drawing Sheets

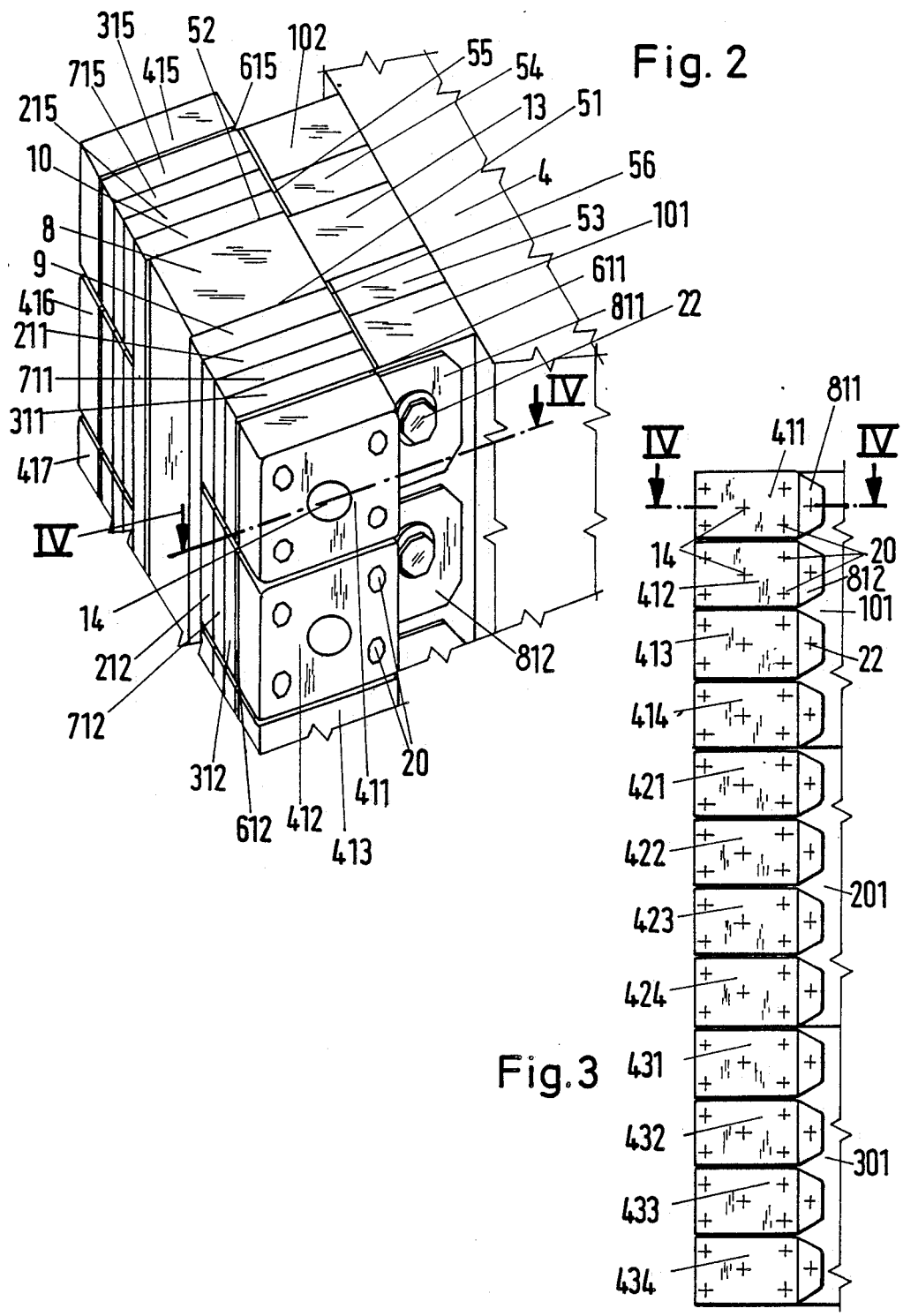

CIRCUIT ARRANGEMENT HAVING A PLURALITY OF ELECTRICAL ELEMENTS TO BE COOLED

BACKGROUND OF THE INVENTION

The invention relates to apparatus for cooling a plurality of electrical elements in a circuit arrangement.

It is an object of the invention to provide a circuit arrangement of compact construction which is electrodynamically stable even with low-resistance high-current circuits, which ensures optimum, even cooling of the elements and only requires one cooling medium inlet and one cooling medium outlet connection, without additional cooling medium piping and fittings being required.

The present invention relates to the solution of this problem.

SUMMARY OF THE INVENTION

The advantages of the invention are essentially achieved by the elimination of additional installations for the cooling medium through the design of the electrical conductors as a cooling medium circulation channel and in that the parallel cooling configuration, cools all elements to approximately the same temperature so that the heat-related electrical efficiency of the elements remains at the same equally high level.

Advantageously, the cooling medium distributor is centrally located in the circuit assembly in the form of a middle bar having two sides, one side having a cooling medium inlet channel and the second side having a cooling medium outlet channel for inlet of cooling medium and outlet to the electrical elements therein. The distributor or middle bar also serves as an electrical conductor and the electrical elements and their conductors are built on it, or connected to it. In a compact, simply fitted and mechanically stable manner in a sandwich-like construction. Thus the middle bar forming the joint cooling medium distributor is also the central electrical conductor in the circuit assembly on which all of the other circuit elements are connected.

BRIEF DESCRIPTION OF THE DRAWINGS

There follows a more detailed explanation of an embodiment of the invention with reference to the drawings. There are shown in.

DESCRIPTION OF THE PREFERRED EMBODIMENT

Figure 1:
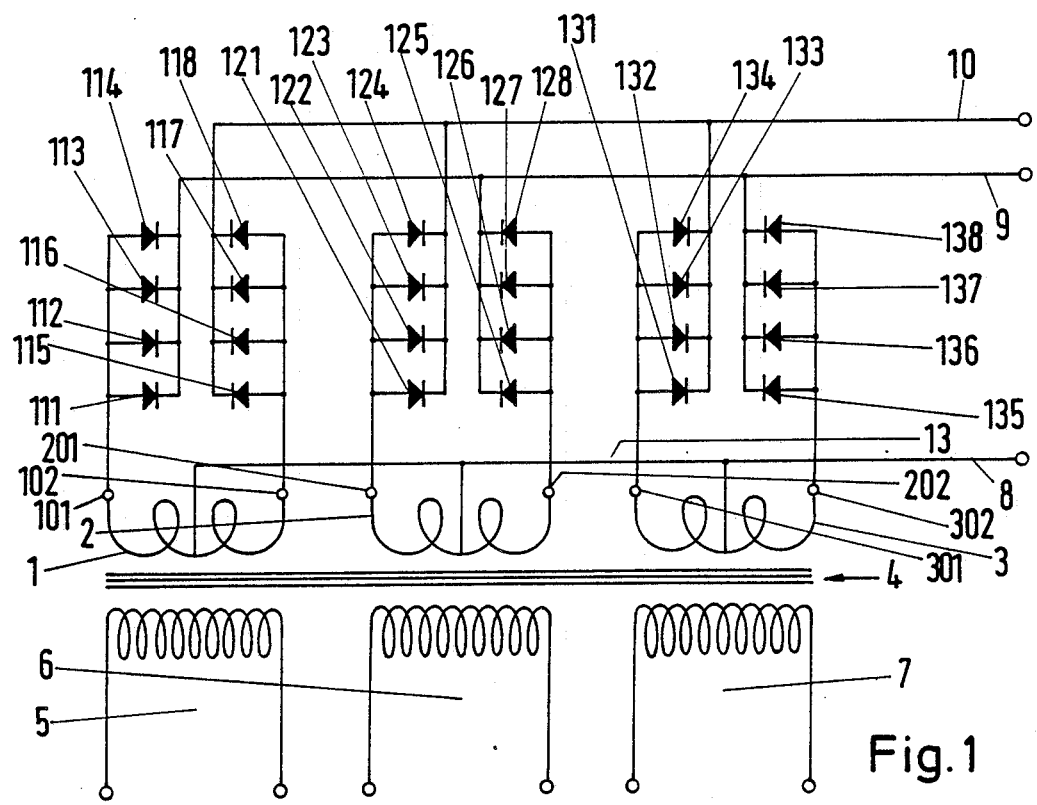
FIG. 1 an electrical circuit diagram of a circuit arrangement of a three-phase transformer with semiconductor diodes, FIG. 2 a perspective representation of part of the circuit arrangement of FIG. 1, FIG. 3 a side schematic view of the pressure plates of the circuit arrangement, FIG. 4 a section view taken substantially along lines IV—IV in both FIGS. 2 and 3.

The circuit arrangement may be used in a DC resistance welding machine. It consists of a three phase high-current transformer 4 having primary windings 5, 6, 7 and secondary windings 1, 2, 3. The secondary windings 1, 2, 3 are connected at the ends to copper bars 101/102, 201/202 and 301/302 and each secondary winding has one middle tapping connected to a middle tapping bar 13 (of copper) (FIGS. 1, 2, 3). A middle bar 8 is connected to middle tapping bar 13 by screws (not shown) so that the bars 8 and 13 are joined in an electrically conductive and mechanically stable manner. The bars 101, 201, 301 are disposed aligned together in a row parallel to the bar 13 to the right side thereof shown in FIG. 2 and insulated and spaced therefrom by an insulating plate 53 (FIGS. 2 and 3). The bars 102, 202, 302 are correspondingly disposed in a row to the left side of the bar 13 or on the back side of bar 13 from bars 101, 201, 301, and separated therefrom by an insulating plate 54. The bars 13, 101, 102, 201, 202, 301, 302 and the insulating plates 53, 54 thus form a package disposed on the front side of the transformer 4. An insulating foil 55 and 56 is disposed between the surface of the row of bars 101, 201, 301 and/or 102, 202, 302 away from the transformer and other parts of the circuit arrangement to be described below.

Rectification is effected in each case by four semiconductor diodes for the half wave of each phase. The polarity of the output voltage to the output conductors of the diodes formed by elongated plate-like electrical conductors 9, 10 is positive, but can, however, be changed over to negative if required by fitting all the diodes into their holders with reversed polarity.

The total of twenty-four diodes 111–118, 121–128 and 131–138 are disposed in two rows of twelve diodes each on both sides of the middle bar 8 and designated by three-digit reference numbers beginning with the number 1. The second numbers .1. to .3. designate the phase, the third numbers are a continuous number from ..1 to ..4 for the diodes to the right of the middle bar 8 and ..5 to ..8 for those on the left side.

Figure 4:
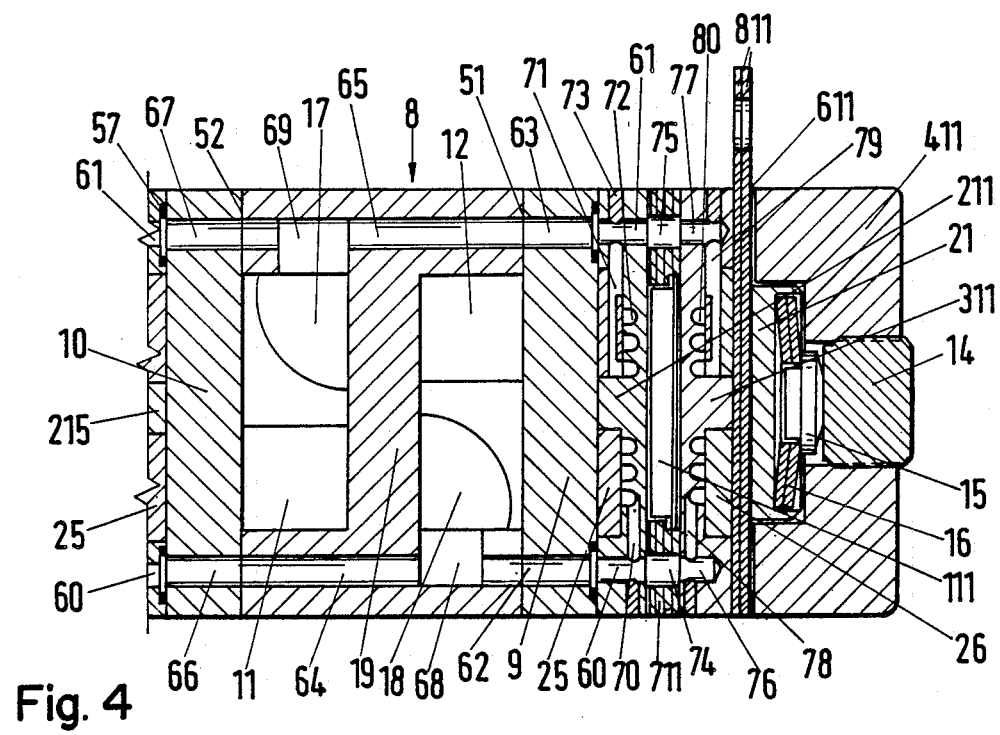

The removal of the dissipated heat of the diodes 111 to 138 is effected by means of cooling water flowing in the electrical conductors. The rectangular middle bar 8 has on its lower end face one connection each 17, 18 for the inflow and outflow of cooling water which open directly into cavities 11, 12 in its interior. The cavities 11, 12 are designed as U-shaped cut-outs opposite to one another, whereby the cavity 11 in FIG. 4 is open to the left and cavity 12 to the right and the two cavities are separated from one another by a crosspiece 19, the width of which is sufficient to provide through holes for screws (not shown) for securing the middle bar 8 to the middle tapping bar 13. The cooling water is sealed in the cavity 11 from the plate 10 by means of a sealing and insulating foil 52 by lying between the middle bar 8 and the plate 10 and, analogously, the cavity 12 is sealed from the plate 9 by means of a sealing and insulating foil 51. Since the middle bar 8 has a different potential from the two plates 9 and 10, the sealing and insulating foils 51, 52 provide electrical insulation as well as liquid sealing.

The plate 9 with the foil 51 and the plate 10 with the foil 52 are each screwed onto one side of the middle bar 8 with an assembly constructed in layers containing a diode by means of four screws 20 for each assembly. Each assembly comprises from inside to outside an inner connection conductor plate adjacent to the plate 9 or 10, the diode with resilient intermediate plate, an outer connection conductor plate, a twin conductor, an outer insulating foil and a pressure plate.

The connection conductor plates resting against the electrodes (cathode and anode) of the diode are hereinafter referred to as electrode plates.

The designation of the two electrode plates, the resilient intermediate material, the two connection pieces, the outer insulating foil and the pressure plate follows that of the diodes with three-digit reference numbers, whereby the inner electrode plate between diode and plate 9 or 10 is given a number beginning with the FIG. 2..., (211, 212, 215...) the following resilient intermediate plate beginning with 7..., (711, 712, 715...) the outer electrode plate beginning with 3..., (311, 312, 315...) the twin conductor beginning with 8..., (811 ...) the outer insulating foil beginning with 6..., (611, 612, 115...) and the pressure plate beginning with 4... (411-414, 415-417, 421-424, 431-434,...). The respresentative assembly shown in FIG. 4 is composed of the inner electrode plate 211, the outer electrode plate 311, the resilient intermediate plate 711, the twin conductor 811, the outer insulating foil 611, and the pressure plate 411, and wherein the diode 111 is secured with the plate 9 and the sealing and insulating foil 51 by the four screws 20 to the middle bar 8 by means of the pressure plate 411 as counter plate. In order to achieve the pressure required for a good electrical contact of the diode 111 the pressure plate 411 has a pressure screw 14 with a cylinder head 15, a pressure spring 16 and a pressure washer 21. Similarly, the remaining assemblies containing the diodes 112-114, 121-124 and 131-134 are secured with the plate 9 and the foil 51 and the assemblies containing the diodes 115-118, 125-128 and 135-138 are secured with the plate 10 and the foil 52 to the right (front) and left (rear) sides of the middle bar 8.

The screws 20 are conductive and contained in insulating sheaths so that the pressure plates 411-438 have the same electrical potential as the middle bar 8 and the intermediate parts are insulated from the plates 411-438 and the bar 8. Plates 9 and 10 and the inner electrode plates 211, 212, ..., which are insulated from the middle bar 8 and the outer electrode plates 311, 312 by means of the insulating foil 51 and the intermediate plate 711, 712, ... have the same potential. The outer electrode plates 311, 312, ... have similar potential with the twin conductors 811, 812, ..., which are insulated by means of the insulating foils 611, 612, ... from the pressure plate 411, 412, ... and by means of the intermediate plate 711, 712, ... from the inner electrode plate 211, 212, ....

The diodes 111 to 114, 121 to 124 and 131 to 134 lie flat immediately against the relevant inner electrode plates 211 to 214, 221 to 224 and 231 to 234 and these, in turn, lie against the plate 9; the remaining diodes 115 to 118, 125 to 128 and 135 to 138 on the left or rear side of the structure and not shown in FIGS. 2-4, lie by analogy against the plates 215, 216, ... and these against the plate 10. Both plates 9 and 10 have the same electrical potential and are only separated from one another on the basis of the mechanical construction.

The electrical connection of the diode anodes to the bars 101, 102, 201, 202, 301, 302 connected with the secondary windings 1, 2, 3 of the transformer 4 is effected by means of the twin conductors 811, 812, ... and the outer electrode plates 311, 312, .... The twin conductors 811, 812, ... are secured with screws 22 to the bar 101, 102, .... Four diode anodes are connected per bar or per end of the secondary windings 101, 102, 201, 202, 301, 302. Thus, for example, the anodes of the diodes 111, 112, 113, 114 are fixed to the bar 101 of the winding of the first phase 1 by means of the twin conductors 811, 812, ... and the outer electrode plates 311, 312.

The width of the plates 9 and 10 is slightly wider (by a few millimeters) than the width of the adjoining surface of the middle bar 8 (FIG. 2) so as to be able to link the two plates 9 and 10 having the same potential electrically by means of plate-shaped conductors (not shown) without contact with the middle bar 8 over and above this.

The entire sandwich-like design permits the connection to the middle bar 8 and the plates 9 and 10 of electrical consumers such as welding machines. The bore holes required herefor (not shown) for connecting the contact rails to the consumer are already present on the sides of the middle bar 8 and the plates 9 and 10 pointing away from the transformer 4 (outside the area of the cooling water bore holes and the cavities).

The cooling medium piping or channels to the diodes 111-138 is now explained on the basis of FIG. 4 taking as example the cooling medium piping to diode 111 and 112. The cooling medium piping to the other diodes is effected in analogous manner.

Two bore holes 60 and 61 running in the direction of the sandwich-like assembly are disposed on each of the upper and lower edges of the inner electrode plate 211 shown in FIG. 4. These bore holes 60 and 61 are continued via in each case a drill hole 62 and 63 in the plate 9 aligned thereto in the direction toward the middle bar 8 and linked to in each case one bore hole 64 and 65 in the middle bar 8 with the corresponding bore holes 66 and 67 in the plate 10. The bore hole 64 is connected to the cavity 12 and the bore hole 65 is connected with the cavity 11 by means of cut-outs 68 and 69 respectively parallel to the crosspiece 19.

The bore hole 61 is linked via a further bore hole 71 leading radially from the edge of the inner electrode plate 211 through a lid 25 with the inner end of a cooling channel 72 formed by a groove having several windings, for example spiral shaped windings, lying in a plane parallel to the diode barrier layer and the bore hole 60 is linked by a bore hole 70 with the outer end of the same cooling channel 72. The cooling channel 72 is covered by the lid 25 which terminates with the inner electrode plate 211 to form a tight cooling water system. The part of the bore hole 70 leading from the outer edge of the inner electrode plate 211 to the bore wall of the bore hole 60 and also the corresponding part of the bore hole 71 are each provided with a plug 73.

The diameter of the resilient intermediate plate 711 has, in comparison to the bore holes 60 and 61 in the inner electrode plate 211, enlarged bore holes 74 and 75 running in the direction of the axis thereof.

Bore holes 74 and 75 in the resilient intermediate plate 711 are continued along the same axis direction in the outer electrode plate 311 and end there in blind holes 76, 77 respectively.

From the blind hole 77 in the electrode plate 311 a bore hole 79 leads radially from the edge of the electrode plate 311 through a lid 26 and leads to the inner end of a, for example, spiral-shaped cooling channel 80 formed by a groove by analogy with the cooling channel 22 in the electrode plate 211 and the lid 25.

Recesses are provided at the exits of the bore holes 62, 63, 66, 67 ending at the surface facing away from the middle bar 8 to accommodate seal rings 57 which reliably seal the bore junctions.

Starting from connection 17 of the cooling medium inlet from a heat exchanger or cold water connection (not shown) the inflowing water is distributed from the cavity 11 by means of parallel cooling circulations to the individual diodes to be cooled and is led back to the heat exchanger or to a waste water piping via the cavity 12 and its outlet 18. The flow of cooling medium to the individual diodes is again described using are example the two diodes 111 and 115 arrranged symmetrically to the middle bar 8. The cooling water flows from the cavity 11 into the cut-out 69 and branches there into the bore hole 65 to the right and to the diodes 111 and 115 to the left. The right path leads via the bore holes 63, 61 and branches in the inner electrode plate 211 via the bore holes 71 in the direction of the cooling channel 72, cools the cathode of the diode 111 during its, for example, spiral path therethrough and then flows through the bore holes 70, 60, 62, 64 and the cut-out 68 back via the cavity 12 to the outlet 18. The other cooling water path of the branch into the inner electrode plate 211 leads further via the bore hole 61 to the bore hole 75, the blind hole 77 and the bore hole 79 to the cooling water channel 80, cools the anode of the diode 111 at this point and flows back via the bore hole 78, the blind hole 76, the bore hole 74, joins up in the bore hole 60 with the cooling water of the cathode and then flows along the above described path to the outlet 18. The left path leads from the cut-out 69 via the bore holes 65, 67 to the branch in the inner electrode plate 215 whereby cathode and anode of the diode 115 are cooled as described above and the cooling water flows back through the bore holes 66, 64 and the cut-out 68 to the cavity 12.

Other coolable electrical elements, for example resistances, can be incorporated in place of the diodes 111 to 138 with corresponding adapted electrode plates 211 to 238 and 311 to 338.

It is, however, also possible to use in each case only one to three semiconductor diodes instead of the in each case four semiconductor diodes 111 to 138 for each phase half wave. It is also possible to incorporate other electrical elements to be cooled, e.g. resistance with correspondingly adapted electrode plates 211 to 238 and 311 to 338 in place of the diodes 111 to 138.

The three phase high-current transformer 4 can also be replaced by three single phase high-current transformers, the secondary windings of which are connected on one side to the copper bar 101/102, 201/202 and 301/302 and to in each case one middle tapping bar 13. In place of the three single phase high-current transformers with secondary side middle tappings it is also possible to use rectifier circuits in a bridge circuit, in which case the middle bar 8 is absent and one or both plates of the direct current conductor or one each of the cavities 11 or 12 takes up the cavities 11, 12 for inflowing or outflowing cooling water. Switch arrangements with fewer than three phases are also possible.

The preferred material for assemblies in which cooling water is conducted is electrolytic copper. It has been found that, unlike, for example, aluminium, electrolytic copper shows no corrosion or only slight corrosion when tap water is used as the cooling medium.

It was surprisingly found in the context of the invention that normal (electrically conductive) tap water can be used as cooling material. This is based on the finding that the potential differences between the individual assembles electrically insulated by insulation material 51, 52, 711, 712, . . . , but traversed by the same cooling medium flow are minimal. Electrochemical material erosion is reliably avoided by using copper and copper alloys for all the conductors coming into contact with the cooling fluid, but would, for example, occur in the case of aluminium. Instead of normal to tap water it is of course also possible to use poorly conducting or insulating cooling fluids such as deionized water or oil.

The cooling water inlets and outlets 17 and 18 are provided on the lower front end of the middle bar 8, but can also be provided on the upper face end of the middle bar 8 without impairing the mode of operation.

In the case of plates 9, 10, 211 and 215, . . . consisting of electrolytic copper, i.e. of a soft material, the seal rings 57 may be dispensed with and the surfaces of the plates 9 and 10 and/or the surfaces of the adjacent plates 211 and 215, . . . can be roughened with ridges so that they form a seal when subsequently assembled by tightening the screws 20 between the pressure plate 411, 412, . . . and the middle bar 8.

What is claimed:

1. A circuit arrangement, comprising
    a transformer (4) having at least one secondary winding (1, 2, 3) with a center tapping (13),
    a plurality of rectifier elements (111–118, 121–128, 131–138),
    a plurality of substantially plate-like electrical conductors (9, 10, 211, 311, 212, 312, 215, 315) for electrically connecting said rectifier elements (111–118, 121–128, 131–138), said plate-like electrical conductors having channels therethrough adapted to carry a cooling medium for cooling said rectifier elements,
    a cooling medium distributor (8) in the form of a electrically conductive substantially rectangular bar having a first and a second side, opposite to one another, and a third side, and having an inlet cavity (11) and an outlet cavity (12) for a cooling medium, said inlet cavity (11) being in said first side and said outlet cavity (12) being in said second side,
    said electrical conductors (9, 10, 211, 311, 212, 312, 215, 315) and said rectifier elements (111–118, 121–128, 131–138) being arranged in rows along said first side and said second side of said distributor (8), means holding said distributor (8) and said rows of said conductors and rectifier elements together in sandwich-like manner with the distributor in the middle, and
    said third side of said electrically conductive cooling medium distributor being electrically connected with said center tapping (13) of said secondary winding (1, 2, 3).

2. A circuit arrangement according to claim 1, wherein
    said tranformer (4) has a plurality of secondary windings (1, 2, 3) each having a center tapping and a first end tapping (102, 202, 302) and a second end tapping (101, 201, 301),
    a plurality of groups of said rectifier elements,
    each group of said rectifier elements (111–118, 121–128, 131–138) respectively associated with a respective one of said secondary windings (1, 2, 3), each group of said rectifier elements including first and second rectifier elements arranged opposite to one another on said first side and at said second side of the distributor (8),
    each of said first rectifier elements (115–118, 125–128, 135–138) is disposed between a first pair (215/315) of said electrical conductors and each of said second rectifier elements (111–114, 121–124, 131–134) is disposed between a second pair (211/311, 212/312) of said electrical conductors, so that to each secondary winding (1, 2, 3) there is associated a respective group of first and second pairs of electrical conductors arranged opposite to one another on said first side and on said second side of the distributor, the first end tapping (102, 202, 302) of each secondary winding (1, 2, 3) being electrically connected with one electrical conductor (315) of each of said first pairs (215/315) of electrical conductors associated with the respective secondary winding (1, 2, 3), the second end tapping (101, 201, 301) of each secondary winding (1, 2, 3) being electrically connected with one electrical conductor (311, 312) of each of said second pairs (211/311, 212/312) of said electrical conductors associated with the respective secondary winding, and the center tapping (13) of each secondary winding (1, 2, 3) being electrically connected with a third side of said electrically conductive cooling medium distributor.

3. A circuit arrangement according to claim 1, wherein said channels (60-63, 66, 67, 70-72, 76-80) of said electrical conductors (9, 10, 211, 311, 212, 312, 215, 315) are connected in parallel to said inlet cavity (11) and outlet cavity (12) in said cooling medium distributor (8).

4. A circuit arrangement according to claim 1, in which each of said rectifier elements (111-118, 121-128, 131-138) is disposed between a pair of said substantially plate-like electrical conductors (9, 10, 211, 311, 212, 312, 215, 315).

5. A circuit arrangement according to claim 4, including electrically insulating means (51, 52, 711, 712, ...) having holes passing therethrough (74, 75) for passage of the cooling medium, and the two electrical conductors (9, 10, 211, 311, 212, 312, 215, 315) of each of said pairs being insulated electrically from one another by said electrically insulating means.

6. A circuit arrangement according to claim 1, wherein said inlet cavity (11) and outlet cavity (12) are separated from one another and extend over the entire length of said rows of said electrical conductors (9, 10, 211, 311, 212, 312, 215, 315) and said rectifier elements (111-118, 121-128, 131-138).

7. a circuit arrangement according to claim 1, in which said transformer (4) has a plurality of secondary windings (1, 2, 3) each having a center tapping, a center tapping bar (13) connected to the center tappings of said secondary windings (1, 2, 3), and said third side of said electrically conductive cooling medium distributor (8) resting against said center tapping bar (13) in electrically conductive contact.

8. A circuit arrangement according to claim 1, including an electrically insulating foil means (51, 52) provided with holes for passage the cooling medium, and at least one of said rows of said electrical conductors (9, 10) being separated from said first and second sides of said distributor (8) by said electrically insulating foil means (51, 52).

9. A circuit arrangement according to claim 1, wherein each of said rectifier elements (111-118, 121-128, 131-138) is a semiconductor diode disposed between a pair of said substantially plate-like electrical conductors (211, 311, 212, 312, 215, 315), the said channels (92, 80) of each of said electrical conductors of said pairs having with several windings lying in a plane substantial parallel to the semiconductor diode, one end of each respective channel (72, 80) communicating with said inlet cavity (11) and the other end of each respective channel communicating with said outlet cavity (12) of said distributor (8).

10. A circuit arrangement according to claim 1, in which said cooling medium distributor (8) and said electrical conductors (9, 10, 211, 311, 212, 312, 215, 315) are formed of a conductive material moldable under pressure.

11. A circuit arrangement according to claim 1, wherein said cooling medium distributor (8) and said electrical conductors (9, 10, 211, 311, 212, 312, 215, 315) are made of copper or a copper alloy, electrolytic copper respectively.

12. A circuit arrangement, comprising a transformer (4) having a plurality of secondary windings (1, 2, 3) each having a first end tapping (102, 202, 302) and a second end tapping (101, 201, 301), a cooling medium distributor (8) in the form of a bar having a first side and a second side, opposite to one another, and having an inlet cavity (11) and an outlet cavity (12) for a cooling medium, said inlet cavity (11) being in said first side and said outlet cavity (12) being in said second side, a group of rectifier elements (111-118, 121-128, 131-138) for each secondary winding (1, 2, 3), each group including first and second rectifier elements arranged opposite to one another at said first side and at said second side of the distributor (8), a plurality of electrical conductors (9, 10, 211, 311, 212, 312, 215, 315) for electrically connecting said rectifier elements (111-118, 121-128, 131-138), said plurality of electrical conductors having channels therethrough adapted to carry a cooling medium for cooling said rectifier elements, each of said first rectifier elements (115-118, 125-128, 135-138) being disposed between a first pair (215/315) of said electrical conductors and each of said second rectifier elements (111-114, 121-124, 131-134) being disposed between a second pair (211/311, 212/312) of said electrical conductors, so that for each secondary winding (1, 2, 3) there is a respective group of first and second rectifier elements and a respective group of first and second pairs of electrical conductors arranged opposite to one another at said first side and at said second side of the distributor, said electrical conductors (9, 10, 211, 311, 212, 312, 215, 315) and said rectifier elements (111-118, 121-128, 131-138) being arranged in rows along said first side and said second side of said distributor (8), said distributor (8) and said rows of said conductors and rectifier elements being held together in sandwich-like manner with the distributor in the middle, the first end tapping (102, 202, 302) of each secondary winding (1, 2, 3) being electrically connected with one electrical conductor (315) of each of said first pairs (215/315) of electrical conductors associated with the respective secondary winding (1, 2, 3), and the second end tapping (101, 201, 301) of each secondary winding (1, 2, 3) being electrically connected with one electrical conductor (311, 312) of each of said second pairs (211/311, 212/312) of said electrical conductors associated with the respective secondary winding.

13. A circuit arrangement according to claim 12, including a center tapping bar (13), said cooling medium distributor (8) being an electrically conductive substantially rectangular bar having a third side, each of said secondary windings (1, 2, 3) of said transformer having a center tapping, said center tappings of said secondary windings (1, 2, 3) being connected to said center tapping bar (13), and said third side of said distributor resting against said center tapping bar (13) in electrically conductive contact.

14. A circuit arrangement according to claim 12, wherein said channels (60–63, 66, 67, 70–72, 76–80) of said electrical conductors (9, 10, 211, 311, 212, 312, 215, 315) are connected in parallel to said inlet cavity and said outlet cavity (11, 12) of said cooling medium distributor (8).

15. A circuit arrangement according to claim 12, including electrically insulating means (51, 52, 711, 712), insulating the two electrical conductors (9, 10, 211, 311, 212, 312, 215, 315) of each of said pairs from one another, and said electrically insulating means (51, 52, 711, 712) having holes passing therethrough (74, 75) for passage of the cooling medium.

16. A circuit arrangement according to claim 12, wherein said inlet cavity (11) and said outlet cavity (12) are separated from one another and extend over the entire length of said rows of said electrical conductors (9, 10, 211, 311, 212, 312, 215, 315) and rectifier elements (111–118, 121–128, 131–138).

17. A circuit arrangement according to claim 12, including electrically insulating foils (51, 52) provided with holes for passage of the cooling medium, said insulation foils disposed to separate at least one of said rows of said electrical conductors (9, 10 respectively along said first side and said second side of said distributor from said first side and said second side of said distributor (8).

18. A circuit arrangement according to claim 12, wherein each of said rectifier elements (111–118, 121–128, 131–138) is a semiconductor diode the said channels (72, 80) of each of said conductors on opposite sides of each said semiconductor diode having several windings lying in a plane substantial parallel to the semiconductor diode, one end of each respective channel (72, 80) communicating with said inlet cavity (11) and the other end of each respective channel communicating with said outlet cavity (12) of said distributor (8).

19. A circuit arrangement, comprising a transformer (4) having a secondary winding (1) with a first end tapping (102) and a second end tapping (101), a plurality of rectifier elements (111–118), a plurality of substantially plate-like electrical conductors (9, 10, 211, 311, 212, 312, 215, 315) for electrically connecting said rectifier elements (111–118), said plate-like electrical conductors having channels therethrough adapted to carry a cooling medium for cooling said rectifier elements, a cooling medium distributor (8) in the form of a bar having a first side and a second side, opposite to one another, and having an inlet cavity (11) being in said first side and said outlet cavity (12) being in said second side, said electrical conductors (9, 10, 211, 311, 212, 312, 215, 315) and said rectifier elements (111–118) being arranged in rows along said first side and said second side of said distributor (8), said distributor (8) and said rows of said conductors and rectifier elements being held together in sandwich-like manner with the distributor in the middle, each of said rectifier elements (111–118) being disposed between a pair (211/311, 212/312, 215/315) of said electrical conductors, said first end tapping (102) of said second winding (1) being electrically connected with one electrical conductor (315) of each pair (215/315) of said electrical conductors arranged in the row at said first side of said distributor (8) and said second end tapping (101) of said second winding (1) being electrically connected with one electrical conductor (311, 312) of each pair (211/311, 212/312) of said electrical conductors arranged in the row at said second side of said distributor (8).

* * * * *